United States Patent [19]
Ohkubo et al.

[11] Patent Number: 5,159,432
[45] Date of Patent: Oct. 27, 1992

[54] SEMICONDUCTOR DEVICE PACKAGE HAVING IMPROVED SEALING AT THE ALUMINUM NITRIDE SUBSTRATE/LOW MELTING POINT GLASS INTERFACE

[75] Inventors: Soichiro Ohkubo; Masaharu Yasuhara; Akira Ohtsuka, all of Hyogo, Japan

[73] Assignee: Sumitomo Electric Industries, Ltd., Osaka, Japan

[21] Appl. No.: 879,102

[22] Filed: May 4, 1992

Related U.S. Application Data

[63] Continuation of Ser. No. 456,699, Dec. 26, 1989, abandoned.

[30] Foreign Application Priority Data

Dec. 26, 1988 [JP] Japan .................................. 63-330010

[51] Int. Cl.$^5$ ...................... H01L 23/06; H01L 23/10
[52] U.S. Cl. .......................................... 357/74; 357/73
[58] Field of Search ........................... 357/73, 74, 67; 174/52.4

[56] References Cited

U.S. PATENT DOCUMENTS

| | | | |
|---|---|---|---|
| 3,697,666 | 10/1972 | Wakley et al. | 357/74 |
| 3,768,991 | 10/1973 | Rogers | 357/73 |
| 4,656,499 | 4/1987 | Butt | 357/73 |
| 4,704,626 | 11/1987 | Mahulikar et al. | 357/73 |

FOREIGN PATENT DOCUMENTS

| | | |
|---|---|---|
| 0081992 | 6/1983 | European Pat. Off. . |
| 59-92552 | 9/1984 | Japan . |
| 61-150351 | 11/1986 | Japan . |

OTHER PUBLICATIONS

Patent Abstracts of Japan, vol. 8, No. 206 Sep. 2, 1984.
Patent Abstracts of Japan, vol. 10, No. 347 Nov. 21, 1986.
Patent Abstracts of Japan, vol. 11, No. 231 Jul. 28, 1987.

*Primary Examiner*—Rolf Hille
*Assistant Examiner*—S. V. Clark
*Attorney, Agent, or Firm*—Sughrue, Mion, Zinn, Macpeak & Seas

[57] ABSTRACT

A semiconductor device package is disclosed, which comprises: a substrate of AlN with said semiconductor device affixed to it; a barrier layer of high melting point glass affixed to said substrate around said semiconductor device; a first layer of low melting point glass affixed to said barrier layer; a lead frame affixed to said first layer of low melting point glass and connected electrically to said semiconductor device; a second layer of said low melting point glass affixed to said lead frame on the opposite side from said first layer of low melting point glass; and a cap affixed to said second layer of low melting point glass. When the cap is of AlN, a second barrier layer of the high melting point glass is provided between the second layer of low melting point glass and the cap.

6 Claims, 1 Drawing Sheet ns an unexamined published Japanese patent application.)

SEMICONDUCTOR DEVICE PACKAGE HAVING IMPROVED SEALING AT THE ALUMINUM NITRIDE SUBSTRATE/LOW MELTING POINT GLASS INTERFACE

This is a continuation of U.S. Ser. No. 07/456,699 filed Dec. 26, 1992, now abandoned.

FIELD OF THE INVENTION

The present invention relates to a package for a semiconductor device, and particularly relates to a semiconductor-device package which uses an AlN substrate, which has good heat radiating properties, and which can be sealed hermetically with low melting point glass.

BACKGROUND OF THE INVENTION

Plastic packages have been the most widely used packages for sealing semiconductor elements.

Plastic packages are widely used for memory elements of large capacity, operational elements, and the like. Plastic packages are inexpensive but have poor heat radiating properties. Further, plastic packages do not seal completely water or moisture which may easily penetrate them.

In order to improve the hermetic sealing and heat radiating properties of packages, ceramic packages are sometimes used. A multi-layered ceramic package is formed from a laminate composed of a plurality of thin plates of alumina ($Al_2O_3$) or mullite ($Al_6Si_2O_{13}$). Metallized wiring is printed on one of the intermediate alumina plates so that the inside semiconductor chip is connected to an outside lead frame without penetrating a lead frame into the $Al_2O_3$ or mullite plates. Such ceramic packages are very expensive because they are formed of laminations of numbers of thin ceramic plates.

In place of ceramic packages, so called "CER DIP" packages are also used. A CER DIP package constitutes a substrate of $Al_2O_3$ or mullite, a lead frame, and a cap. The substrate, the lead frame, and the cap are sealed with $PbO-B_2O_3$ series low melting point glass.

A package in which pins are arranged in two directions is called a DIP type package. A package in which a substrate of $Al_2O_3$ or mullite, a lead frame, and a cap are sealed with low melting point glass is thus called a CER DIP package, and a package identical to a CER DIP except that the pins are arranged in four directions is called a "CER Quad" package. Both a CER DIP and a CER Quad are often generally called a CER DIP. The term "CER DIP package" used herein includes a CER DIP and CER Quad packages.

A CER DIP package must be distinguished from a ceramic package. Although both are made of ceramic material, a CER DIP package is sealed with glass and a ceramic package is not.

A CER DIP package has higher hermetic sealing, better heat radiating properties, and is more reliable than a plastic package. Further, a CER DIP package is inexpensive compared to a ceramic package.

Packages that have higher heat radiating properties have been developed using an $Al_2O_3$-lamination ceramic package in which a Cu-W cooling plate is brazed onto an element mounting portion as described in JP-A-59-56746 and JP-A-59-61948. Other packages have been developed by using a BeO substrate, because BeO has a higher heat conductivity than that of $Al_2O_3$ as described in JP-A-50-104571. (The term "JP-A" as used herein means an unexamined published Japanese patent application.)

Packages having a Cu-W cooling plate are expensive because the cooling plate is brazed to an $Al_2O_3$ substrate.

Packages using a BeO substrate are difficult to handle because BeO is poisonous.

AlN is known in the art as ceramics having a higher heat conductivity than $Al_2O_3$. Packages formed using an AlN substrate would be expected to have high heat radiating properties. However, there are problems forming a low melting point glass seal on a package having an AlN substrate.

FIG. 3 shows a cross section of a conventional package having an AlN substrate sealed with low melting-point glass.

The package has an AlN substrate 1, a lead frame 4, and a cap 9. The substrate 1, the cap 9, and the lead frame 4 are sealed with low melting point glass 3. The glass 3 is $PbO-B_2O_3$ series low melting point glass which is the same as that used in sealing the $Al_2O_3$ package. In this package, however, a number of air bubbles 5 are formed at the boundary between the AlN substrate or the AlN cap and the low melting-point glass. Because of these air bubbles, the sealing strength of the package is lowered and the hermetic sealing is deteriorated. Water or moisture is thus able to penetrate the package and affect the semiconductor element (chip). The long term reliability of this package is conspicuously lowered.

The air bubbles 5 form because gas is generated at the boundary between the AlN substrate or the AlN cap and the low melting point glass by a chemical reaction between the liquid (molten) $PbO-B_2O_3$ series glass and AlN. Because of the above defects, a package as shown in FIG. 3 is not actually on the market.

SUMMARY OF THE INVENTION

It is therefore an object of the present invention to eliminate the defects in the prior art.

It is another object of the present invention to provide a package using an AlN substrate which can be sealed with low melting-point glass without generating air bubbles at the boundary.

Other objects and effects of the present invention will be apparent from the following description.

In order to prevent air bubbles from occurring, it is necessary to prevent contact between the low melting point glass (such as $PbO-B_2O_3$ series glass) and the AlN substrate and the AlN cap so that no reaction can occur.

The objects of the present invention are attained by providing a barrier layer between the AlN substrate and the low melting point glass such as $PbO-B_2O_3$ series glass.

The objects of the present invention are also attained by using an AlN substrate and a cap of AlN, and providing barrier layers not only between the AlN substrate and the low melting-point glass but also between the AlN cap and the low melting-point glass.

The present invention relates to, in one aspect, a semiconductor device package a semiconductor device package comprising: a substrate of AlN with the semiconductor device affixed to it; a first barrier layer of high melting point glass affixed to the substrate around the semiconductor device; a first layer of low melting point glass affixed to the first barrier layer; a lead frame affixed to the first layer of low melting point glass and connected electrically to the semiconductor device; a second layer of the low melting point glass affixed to the lead frame on the opposite side from the first layer of low melting point glass; a second barrier layer of the high melting point glass affixed to the second layer of low melting point glass; and a cap of AlN affixed to the second barrier layer.

The present invention also relates to, in another aspect, a semiconductor device package comprising: a substrate of AlN with the semiconductor device affixed to it; a barrier layer of high melting point glass affixed to the substrate around the semiconductor device; a first layer of low melting point glass affixed to the barrier layer; a lead frame affixed to the first layer of low melting point glass and connected electrically to the semiconductor device; a second layer of the low melting point glass affixed to the lead frame on the opposite side from the first layer of low melting point glass; and a cap of a material other than AlN affixed to the second layer of low melting point glass.

DETAILED DESCRIPTION OF THE INVENTION

Figure 1:
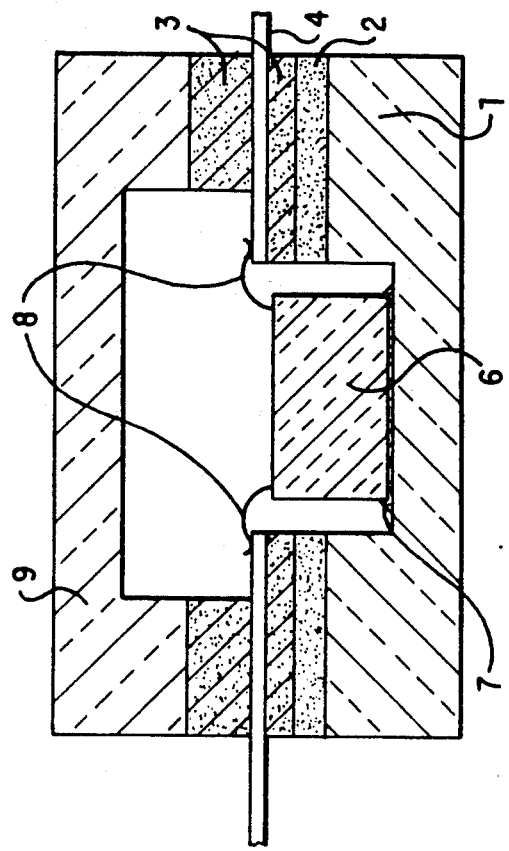
FIG. 1 is a longitudinal cross section showing an embodiment of the semiconductor device package having barrier layers and using AlN according to the present invention.

As the low melting point glass for sealing, $PbO_3$-$B_2O_3$ (such as "LS-3051" made by Nippon Electric Glass Co., Ltd.) series glass is preferably used. In the following description, $PbO_3$-$B_2O_3$ series glass is mainly used as the low melting point glass, but the present invention is not limited thereto. The thickness of the layer of the low melting point glass should be thicker than that of the lead frame, and is generally 150 $\mu$m or more, preferably from 300 to 400 $\mu$m.

Any type of barrier layer may be used so long as it can prevent occurrence of a chemical reaction between the low melting point glass and the AlN substrate. Since the barrier layer must be freely shapable, glass is a suitable material for the barrier layer.

If the melting point of the barrier layer is lower than that of the PbO-$B_2O_3$ series glass as the low melting point glass, the barrier layer might melt earlier than the PbO-$B_2O_3$ series glass and the PbO-$B_2O_3$ series glass would diffuse into the melted barrier layer. Such a barrier layer of a lower melting point cannot function as an effective barrier.

Further, the high melting point glass for the barrier layer should not form bubbles when it is in contact with the AlN substrate.

Accordingly, the glass of the barrier layer is preferably selected so as to have a melting point higher than the PbO-$B_2O_3$ series glass as the low melting point glass and to contain no PbO. For example, ZnO-$B_2O_3$ series glass (such as "#7574" made by Iwaki Glass Co., Ltd.) is preferably used as the high melting point glass.

The combination of the low melting point glass and the high melting point glass is preferably selected such that the working temperature of the low melting point glass is lower than the glass transition point of the high melting point glass. Examples of such a combination include "LS-3051" having a working temperature of 430° C. as the low melting point glass and "#7574" having a glass transition point of 560° C. as the high melting point glass.

The thickness of the barrier layer of the high melting point glass is preferably at least 50 $\mu$m.

Referring to the drawings, embodiments of the semiconductor device package according to the present invention will be described below.

FIG. 1 is a longitudinal cross section showing an embodiment of the semiconductor device package according to the present invention.

A substrate 1 made of AlN has a shape similar to that of the conventional one. That is, the substrate 1 is rectangular and has a rectangular cavity 10 formed in the substrate 1 at its center. A semiconductor chip 6 is die-bonded in the cavity 10 with a die-bonding adhesive 7.

In this embodiment, because a cap 9 is also made of AlN, the cap 9 has higher heat radiating properties than a cap made of $Al_2O_3$ would.

High melting point glass 2 is applied onto the respective bonding surfaces of the AlN substrate 1 and the cap 9. Low melting point glass 3 is applied onto the high melting point glass 2 of the substrate 1, and onto the high melting point 2 of the cap 9. A lead frame 4 is sandwiched between the substrate 1 and the cap 9 and sealed with the low melting-point glass 3. The lead frame 4 is connected to the electrode pads of the chip 6 through bonding wires 8.

Figure 3:
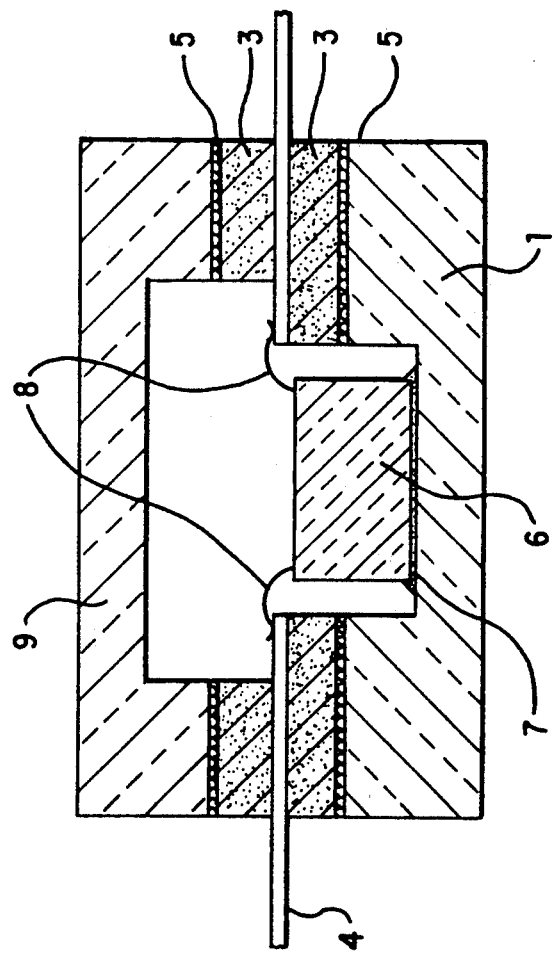
FIG. 3 is a longitudinal cross section of an embodiment of the prior art showing a semiconductor device package in which an AlN substrate is sealed directly with low melting point glass.

A semiconductor device package according to the present invention differs from the package shown in FIG. 3. A package according to the present invention has high melting point glass inserted between the low melting point glass and the AlN substrate so that the low melting point glass does not come into direct contact with the AlN substrate. The package shown in FIG. 3 lacks this high melting point glass. A semiconductor device package according to the present invention may be similar to that of FIG. 3 with respect to the other parts of its construction.

Figure 2:
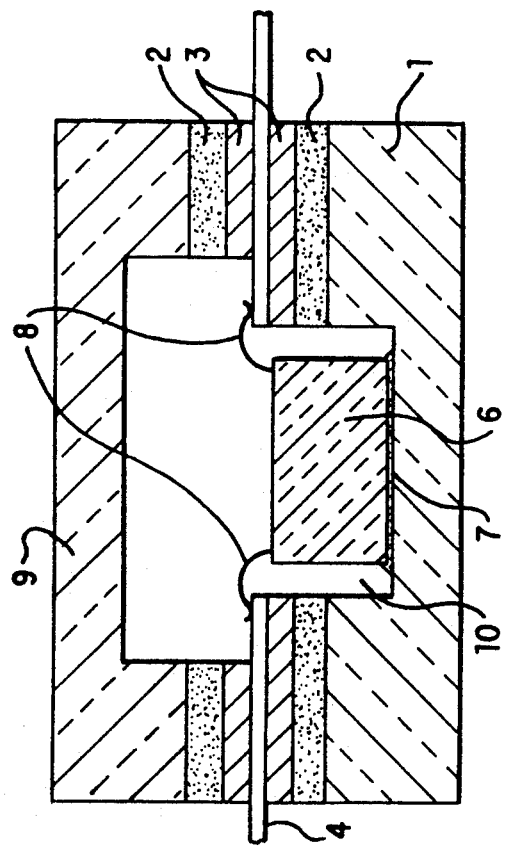
FIG. 2 is a longitudinal cross section showing another embodiment of the semiconductor device package according to the present invention.

FIG. 2 shows another embodiment of the semiconductor device package according to the present invention.

In this embodiment, the cap 9 is not made of AlN, but of Mullite ($Al_2O_{30}SiO_2$) or the like. In this case, because there is no reaction between the low melting point glass and the cap 9, the cap 9 can be in direct contact with the low melting point glass. Thus, no high melting point glass is inserted between the cap 9 and the low melting point glass 3.

The arrangement of this embodiment is simplified more than that of the embodiment shown in FIG. 1. Heat is radiated from the semiconductor chip 6, and this heat is mainly transmitted to the substrate 1 and only partially transmitted to the cap 9. Thus, the cap may be made of conventional Mullite or other oxide ceramics having thermal expansion coefficients near AlN of which heat radiating properties are lower than those of AlN.

According to the present invention, although it is necessary to use AlN for the substrate, the cap may be made of AlN or of any other ceramics.

Using the above mentioned configuration according to the present invention, a CER DIP package using AlN and having high heat radiating properties, a high degree of hermetic sealing, and high reliability can be prepared as easily as conventional sealing technique such as those described, e.g., in *Denshi Zairvo* (Electronic Materials), October 1981, pages 50-54.

A high melting point glass having a melting point higher than that of the sealing low melting point glass may be printed on the AlN substrate through the same process as that used for printing the sealing low melting point glass on the substrate.

A substrate having the high melting point glass printed thereon may be baked at a higher baking temperature than that of the low melting point glass using the same line as that used for printing the low melting point glass. A barrier layer can, thus, be formed through this baking process.

After the sealing of low melting point glass is printed on the barrier layer, the lead frame is attached to the low melting point glass. Next, the semiconductor chip 6 is mounted in the cavity 10. The lead frame is connected to the electrode portions of the semiconductor chip through the bonding wires 8.

A similar process is applied to the cap 9. In the case where the cap is made of AlN, the high melting point glass is printed and baked, and then the low melting point glass is printed and baked. In the case where the cap is made of a material other than AlN, the low melting point glass is printed and baked.

The substrate is sealed with the cap.

Thus, an AlN package can be manufactured by adding only the steps of printing and baking the high melting point glass to the conventional process.

The present invention will be described in more detail referring to the following examples, but the present invention is not construed as being limited thereto.

EXAMPLES

As an example, a package was made according to the conventional process as described, e.g., in *Denshi Zairvo* (Electronic Materials), October 1981, pages 50–54 by using $PbO-B_2O_3$ series glass (LS-3051 made by Nippon Electric Glass Co., Ltd.) as the low melting point glass and $ZnO-B_2O_3$ series glass (#7574 made by Iwaki Glass Co., Ltd.) as the high melting point glass, and the characteristics of the package were examined.

The thickness of the low melting point glass layer was 400 $\mu$m, and the thickness of the barrier layer was 150 $\mu$m. As a substrate and a cap, AlN materials having a dimension of $30 \times 30$ mm and a thickness of 1.27 mm were used.

As to the hermetic sealing of the package, a test according to MIL-STD-883C 1014.7 $A_2$ was performed after sealing. The He leak rate was lower than $1.0 \times 10^{-8}$ atm.cc/sec. This value is equivalent to that of the conventional $Al_2O_3$ package.

Samples of the package were subjected to successive heating and cooling cycles to examine whether the hermetic sealing was lowered or not. A heat cycle within a range of $-65°$ C. to $+150°$ C. was applied under the MIL-STD-883C 1010.6 heat cycle test condition C. Even after 100 cycles, the He leak rate was maintained at a value lower than $1.0 \times 1.0^{-8}$ atm·cc/sec.

To examine the performance of the package against heat shock, another samples of the package were subjected to a heat shock within a range of $0°$ C. to $+100°$ C. (in "Fluorinert" an inert liquid made by 3M Corp.) under the MIL-STD-883C 1011.6 heat shock test condition A. After 100 cycles, the He leak rate was maintained at a value lower than $1.0 \times 10^{-8}$ atm·cc/sec.

Further, still another samples of the package were subjected to the above heat cycle and heat shock tests continuously. Even after the heat cycle and heat shock tests were performed, the He leak rate was maintained at a value of $1.0 \times 1.0^{-8}$ atm·cc/sec.

A cross section of the package was observed. No bubbles were found on the interface between the sealing glass and the substrate or between the sealing glass and the barrier layer. The only bubbles dispersed uniformly in the glass layer of the package were found which generally occurred in the conventional package using $Al_2O_3$ or mullite substrate.

The strength of the package was tested according to MIL-STD-883C 2024.2 torque strength test which was performed on a package constructed using a 30 mm square having a 12 mm square cavity of substrate sealed with glass. A value of from 200 to 300 kgf cm was obtained at the maximum torque strength. The value exceeded the standard value of MIL-STD-883C 2024.2 of 130 kgf·cm.

Thus, a CER DIP package having high hermetic sealing and heat radiating properties and superior mechanical strength can be obtained.

Since AlN is used as a package material, the package has heat radiating properties higher than that of the $Al_2O_3$ package.

Since a barrier layer is provided on the AlN surface, it is possible to form a hermetic seal using low melting-point $PbO-B_2O_3$ glass. A package according to the present invention has high reliability for a long period of time and is inexpensive to manufacture.

While the invention has been described in detail and with reference to specific examples thereof, it will be apparent to one skilled in the art that various changes and modifications can be made therein without departing from the spirit and scope thereof.

What is claimed is:

1. A semiconductor device package comprising:
   a substrate of AlN with said semiconductor device affixed to it;
   a first barrier layer of high melting point glass affixed to said substrate around said semiconductor device, wherein there are no bubbles at the interface between said substrate and said first barrier layer;
   a first layer of low melting point glass affixed to said first barrier layer;
   a lead frame affixed to said first layer of low melting point glass and connected electrically to said semiconductor device;
   a second layer of said low melting point glass affixed to said lead frame on the opposite side from said first layer to low melting point glass;
   a second barrier layer of said high melting point glass affixed to said second layer of low melting point glass; and
   a cap of AlN affixed to said second barrier layer, wherein there are no bubbles at the interface of said cap and said second barrier layer;
   wherein the thickness of said first and said second barrier layers each is at least 50 $\mu$m; and the thickness of said first and second layers of low melting point glass each is from 300 to 400 $\mu$m.

2. A semiconductor device package as claimed in claim 1, wherein:
   said low melting point glass is a $PbO-B_2O_3$ series glass;
   the melting point of said high melting point glass is higher than the melting point of said low melting point glass; and
   said high melting point glass contains no PbO.

3. A semiconductor device package as claimed in claim 2, wherein said high melting point glass is ZnO-$B_2O_3$ series glass.

4. A semiconductor device package as claimed in claim 1, wherein
   said substrate of AlN has a central cavity containing said semiconductor device and a peripheral edge surrounding said central cavity; and
   said first barrier layer of high melting point glass is affixed to said peripheral edge.

5. A semiconductor device package comprising:
   a substrate of AlN with said semiconductor device affixed to it;
   a barrier layer of high melting point glass affixed to said substrate around said semiconductor device, wherein there are no bubbles at the interface between said substrate and said barrier layer;
   a first layer of low melting point glass affixed to said barrier layer;
   a lead frame affixed to said first layer of low melting point glass and connected electrically to said semiconductor device;
   a second layer of said low melting point glass affixed to said lead frame on the opposite side from said first layer of low melting point glass; and
   a cap of a material other than AlN affixed to said second layer of low melting point glass, wherein the thickness of said barrier layer is at least 50 μm; and the thickness of said first and second layers of low melting point glass each is from 300 to 400 μm.

6. A semiconductor device package as claimed in claim 5, wherein said cap is of $Al_2O_3$.

* * * * *